(12) United States Patent
Sawaguchi et al.

(10) Patent No.: US 11,407,201 B2
(45) Date of Patent: Aug. 9, 2022

(54) COMPOSITE MEMBER

(71) Applicants: TOYO INK SC HOLDINGS CO., LTD., Tokyo (JP); TOYOCHEM CO., LTD., Tokyo (JP)

(72) Inventors: Toshiichi Sawaguchi, Tokyo (JP); Naohiro Tanaka, Tokyo (JP); Kaori Sakaguchi, Tokyo (JP); Kenji Andou, Tokyo (JP); Hidenobu Kobayashi, Tokyo (JP)

(73) Assignees: TOYO INK SC HOLDINGS CO., LTD., Tokyo (JP); TOYOCHEM CO., LTD., Tokyo (JP)

( * ) Notice: Subject to any disclaimer, the term of this patent is extended or adjusted under 35 U.S.C. 154(b) by 176 days.

(21) Appl. No.: 16/638,752

(22) PCT Filed: Aug. 13, 2018

(86) PCT No.: PCT/JP2018/030208
§ 371 (c)(1),
(2) Date: Feb. 13, 2020

(87) PCT Pub. No.: WO2019/035445
PCT Pub. Date: Feb. 21, 2019

(65) Prior Publication Data
US 2021/0129489 A1    May 6, 2021

(30) Foreign Application Priority Data

Aug. 14, 2017    (JP) .............................. JP2017-156413

(51) Int. Cl.
*B32B 7/12* (2006.01)
*B32B 7/027* (2019.01)
(Continued)

(52) U.S. Cl.
CPC ................ *B32B 7/12* (2013.01); *B32B 7/027* (2019.01); *B32B 15/08* (2013.01); *B32B 15/20* (2013.01);
(Continued)

(58) Field of Classification Search
CPC ................... H01L 23/373; H01L 23/36; H01L 23/3731; H01L 23/3735; H01L 23/3736; H01L 23/3737; H01L 23/3738
See application file for complete search history.

(56) References Cited

U.S. PATENT DOCUMENTS

2015/0371915 A1* 12/2015 Hashimoto ......... H01L 21/4882
257/531

FOREIGN PATENT DOCUMENTS

JP   2004040049 A  *  2/2004  ............. H01L 24/50
JP   2010006890         1/2010
(Continued)

OTHER PUBLICATIONS

"International Search Report (Form PCT/ISA/210) of PCT/JP2018/030208," dated Sep. 18, 2018, with English translation thereof, pp. 1-3.
(Continued)

*Primary Examiner* — Alicia J Sawdon
(74) *Attorney, Agent, or Firm* — JCIPRNET

(57) ABSTRACT

A composite member (1) satisfies the following expressions. $X/(E \times |CTE(B)-CTE(A)|) \geq 50$, $X/(E \times |CTE(B)-CTE(C)|) \geq 50$, $Y/|CTE(B)-CTE(A)| \times L(BA) \leq 50$, and $Y/|CTE(B)-CTE(C)| \times L(BC) \geq 50$. X: shear bond strength (MPa) between the heat dissipating base substrate and heat generating member, Y: fracture elongation of the thermoconductive insulating adhesive film, E: modulus of elasticity (MPa) of the thermoconductive insulating adhesive film, CTE(A): linear expansion coefficient (° $C.^{-1}$) of the heat dissipating (Continued)

base substrate, CTE(B): linear expansion coefficient ($°C.^{-1}$) of the thermoconductive insulating adhesive film, CTE(C): linear expansion coefficient ($°C.^{-1}$) of the material of the surface of the heat generating member in contact with the thermoconductive insulating adhesive film, L(BA): initial contact length (m) between the thermoconductive insulating adhesive film and the heat dissipating base substrate, and L(BC): initial contact length (m) between the thermoconductive insulating adhesive film and the heat generating member.

15 Claims, 3 Drawing Sheets

(51) Int. Cl.
| | |
|---|---|
| *H01L 23/373* | (2006.01) |
| *B32B 15/08* | (2006.01) |
| *B32B 27/20* | (2006.01) |
| *B32B 15/20* | (2006.01) |

(52) U.S. Cl.
CPC ............ *B32B 27/20* (2013.01); *H01L 23/373* (2013.01); *B32B 2264/1052* (2020.08); *B32B 2264/12* (2013.01); *B32B 2307/206* (2013.01); *B32B 2307/302* (2013.01)

(56) References Cited

FOREIGN PATENT DOCUMENTS

| JP | 2014120727 | 6/2014 |
|---|---|---|
| JP | 2016096263 | 5/2016 |
| JP | 2016111141 | 6/2016 |
| JP | 2016155985 | 9/2016 |
| JP | 2017054967 | 3/2017 |

OTHER PUBLICATIONS

"Office Action of Japan Related Application No. 2018-130155", dated Aug. 7, 2018, with English translation thereof, p. 1-p. 10.

* cited by examiner

COMPOSITE MEMBER

CROSS-REFERENCE TO RELATED APPLICATION

This application is a 371 application of the International PCT application serial no. PCT/JP2018/030208, filed on Aug. 13, 2018, which claims the priority benefit of Japan Patent Application No. 2017-156413, filed on Aug. 14, 2017. The entirety of each of the abovementioned patent applications is hereby incorporated by reference herein and made a part of this specification.

TECHNICAL FIELD

The present invention relates to a composite member in which a heat dissipating base substrate is bonded to at least one surface of a heat generating member including a heat generating part capable of generating heat via a thermoconductive insulating adhesive film.

BACKGROUND ART

It is preferable to dispose a thermoconductive insulating adhesive film between a heat dissipating base substrate of a heat dissipating member and a heat generating member to promote heat conduction from the heat generating member capable of generating heat of various electronic components (for example, a power semiconductor element and a power card including the same) to the heat dissipating member such as a heat sink, thereby promoting heat dissipation. The thermoconductive insulating adhesive film preferably includes a thermoconductive insulating filler and a binder resin because then high thermal conductivity can be exhibited.

The thermoconductive insulating adhesive film can be easily formed by disposing a thermoconductive insulating sheet having a thermoconductive filler and an uncured product and/or semi-cured product of a binder resin which is a thermosetting resin between a heat dissipating member and a heat generating member, and performing curing through heating and pressing.

For example, Patent Literature 1 discloses a power semiconductor device including a semiconductor module in which a metal plate, a solder layer, and a semiconductor chip are laminated in this order; and a heat dissipating member, in which a cured body of an epoxy resin composition comprising an epoxy resin monomer, a novolak resin curing agent, and a mixed filler of α-alumina and boron nitride is disposed between the metal plate and the heat dissipating member. In this power semiconductor device, the semiconductor module is a heat generating member, and the cured body of the epoxy resin composition is a thermoconductive insulating adhesive film.

CITATION LIST

Patent Literature

[Patent Literature 1]
Japanese Patent Laid-Open No. 2016-155985

SUMMARY OF INVENTION

Technical Problem

In Patent Literature 1, the epoxy resin composition in a semi-cured state (preferably a sheet-shaped molded body) is disposed between the heat dissipating member and the semiconductor module that is a heat generating member, and is cured through heating and pressing, whereby a strong adhesive force is exhibited. However, because a cured body of the epoxy resin composition is very hard, an effect of relieving stress caused by swelling or expansion and contraction of a heat dissipating member and a heat generating member which is associated with temperature change is very weak. Accordingly, cracks and/or peeling may occur in a thermoconductive insulating adhesive film made of the cured body of the epoxy resin composition due to stress and strain caused by temperature change, and an insulation property and/or thermal conductivity may deteriorate.

In a case where a heat generating member such as a power semiconductor element or a power card including the same is mounted on a vehicle or the like to be used, environmental temperatures for the use are severe, and the temperatures span a wide range from temperatures (in low-temperature environments) of, for example, about −40° C. (for example, in winter in high latitude regions) to temperatures (in high-temperature environments) of, for example, about 150° C. or higher, which is a heat generation temperature of the heat generating member (the heat generation temperature depending on an output of the heat generating member). It is preferable that cracks and peeling not be generated in the thermoconductive insulating adhesive film, enabling it to maintain a high insulation property and thermal conductivity even when the heat generating member is used under such conditions of large temperature changes.

The present invention has been made in view of the above circumstances, and an objective of the present invention is to provide a composite member that has a structure in which a heat dissipating base substrate is bonded to at least one surface of a heat generating member including a heat generating part capable of generating heat via a thermoconductive insulating adhesive film, the composite member having excellent durability even when used under conditions of a large temperature change.

Solution to Problem

In the composite member of the present invention,
a heat dissipating base substrate is bonded to at least one surface of a heat generating member including a heat generating part capable of generating heat via a thermoconductive insulating adhesive film, and
the composite member satisfies Expressions (1-0) to (4-0) (where $|CTE(B)-CTE(A)|>0$ and $|CTE(B)-CTE(C)|>0$).

$$X/(E \times |CTE(B)-CTE(A)|) \geq 50 \quad (1\text{-}0)$$

$$X/(E \times |CTE(B)-CTE(C)|) \leq 50 \quad (2\text{-}0)$$

$$Y/|CTE(B)-CTE(A)| \times L(BA) \geq 50 \quad (3\text{-}0)$$

$$Y/|CTE(B)-CTE(C)| \times L(BC) \geq 50 \quad (4\text{-}0)$$

The symbols in the above expressions indicate the following parameters:
X: shear bond strength (MPa) at 25° C. between the heat dissipating base substrate and the heat generating member which are bonded to each other via the thermoconductive insulating adhesive film,
Y: fracture elongation at 25° C. of the thermoconductive insulating adhesive film,
E: modulus of elasticity (MPa) at 25° C. of the thermoconductive insulating adhesive film, CTE(A): linear expansion coefficient (° C.$^{-1}$) of the heat dissipating base substrate, CTE(B): linear expansion coefficient (° C.$^{-1}$) of the thermoconductive insulating adhesive film, CTE(C): linear expansion coefficient (° C.$^{-1}$) of a material of a surface of the heat generating member in contact with the thermoconductive insulating adhesive film, L(BA): initial maximum uniaxial length (m) of a region of the thermoconductive insulating adhesive film in contact with the heat dissipating base substrate, and L(BC): initial maximum uniaxial length (m) of a region of the thermoconductive insulating adhesive film in contact with the heat generating member.

Advantageous Effects of Invention

According to the present invention, it is possible to provide a composite member that has a structure in which a heat dissipating base substrate is bonded to at least one surface of a heat generating member including a heat generating part capable of generating heat via a thermoconductive insulating adhesive film, the composite member having excellent durability even when used under conditions of a large temperature change.

DESCRIPTION OF EMBODIMENTS

[Composite Member]

Figure 1:
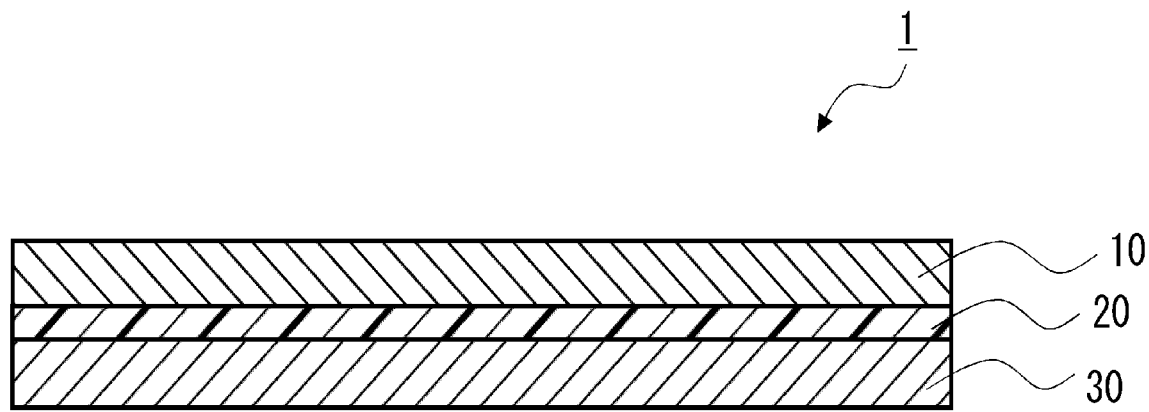
FIG. 1 is a schematic cross-sectional view of a composite member according to a first embodiment of the present invention.

The present invention relates to a composite member in which a heat dissipating base substrate is bonded to at least one surface of a heat generating member including a heat generating part capable of generating heat via a thermoconductive insulating adhesive film.

In general, in the composite member having the above-described structure, cracks and/or peeling occur in the thermoconductive insulating adhesive film because of stress strain caused by temperature changes due to a difference in linear expansion coefficient between each member, and there is a concern of deterioration in an insulation property and thermal conductivity.

A temperature range of the composite member is from the lower limit of a temperature in low-temperature external environments under which the composite member is used to the upper limit of a temperature in high-temperature heat generating environments to which the composite member is exposed when the heat generating member generates heat. For example, examples of the heat generating member include a power semiconductor element and a power card including the same. In a case where such a heat generating member is mounted in a car or the like to be used, the lower limit of a temperature in low-temperature external environments is estimated to be, for example, about −40° C. (for example, in winter in high latitude regions), and the upper limit of a temperature in high-temperature heat generating environments is estimated to be, for example, about 150° C. or higher (the heat generation temperature depending on an output of the heat generating member).

When a temperature change of the composite member is ΔT (° C.), an estimated ΔT is, for example, 50° C. or higher, 100° C. or higher, 150° C. or higher, or 200° C. or higher. It is preferable that cracks and/or peeling be inhibited in the thermoconductive insulating adhesive film even when the heat generating member is used under such conditions of large temperature changes.

Peeling of the thermoconductive insulating adhesive film is considered to be inhibited when a shear bond strength of the thermoconductive insulating adhesive film is sufficiently high with respect to thermal stress. Cracks in the thermoconductive insulating adhesive film are considered to be inhibited when a fracture elongation of the thermoconductive insulating adhesive film is sufficiently high with respect to a magnitude of strain (strain length) caused by a difference in linear expansion coefficient of each member.

In the present specification, the following symbols indicate the following parameters:

X: shear bond strength (MPa) at 25° C. between the heat dissipating base substrate and the heat generating member which are bonded to each other via the thermoconductive insulating adhesive film, Y: fracture elongation at 25° C. of the thermoconductive insulating adhesive film, E: modulus of elasticity (MPa) at 25° C. of the thermoconductive insulating adhesive film, CTE(A): linear expansion coefficient (° C.$^{-1}$) of the heat dissipating base substrate, CTE(B): linear expansion coefficient (° C.$^{-1}$) of the thermoconductive insulating adhesive film, CTE(C): linear expansion coefficient (° C.$^{-1}$) of a material of a surface of the heat generating member in contact with the thermoconductive insulating adhesive film, L(BA): initial maximum uniaxial length (m) of a region of the thermoconductive insulating adhesive film in contact with the heat dissipating base substrate, and L(BC): initial maximum uniaxial length (m) of a region of the thermoconductive insulating adhesive film in contact with the heat generating member.

Expressions (1-A) and (2-A) shows that a shear bond strength of the thermoconductive insulating adhesive film is sufficiently high with respect to thermal stress.

$$X \geq E \times (|CTE(B) - CTE(A)| \times \Delta T) \tag{1-A}$$

$$X \geq E \times (|CTE(B) - CTE(C)| \times \Delta T) \tag{2-A}$$

A linear expansion coefficient is an index indicating a degree of expansion per 1° C., and therefore, a difference in the degree of expansion of materials of members adjacent to each other at a temperature change ΔT is expressed by multiplying the temperature change ΔT by an absolute value of a linear expansion coefficient difference between the materials of the members adjacent to each other. A thermal stress is expressed by multiplying the obtained value by a modulus of elasticity of the thermoconductive insulating adhesive film. It can be said that a shear bond strength of the thermoconductive insulating adhesive film is sufficiently high with respect to a thermal stress when the shear bond strength of the thermoconductive insulating adhesive film is equal to or greater than this value.

Expressions (1-B) and (2-B) are obtained from Expressions (1-A) and (2-A).

$$X/(E \times |CTE(B)-CTE(A)|) \geq \Delta T \quad (1\text{-}B)$$

$$X/(E \times |CTE(B)-CTE(C)|) \geq \Delta T \quad (2\text{-}B)$$

In the composite member of the present invention, Expressions (1-B) and (2-B) can be satisfied when ΔT is 50° C. or higher, preferably 100° C. or higher, more preferably 150° C. or higher, and particularly preferably 200° C. or higher.

Expressions (3-A) and (4-A) shows that a fracture elongation of the thermoconductive insulating adhesive film is sufficiently high with respect to strain length.

$$Y \geq |CTE(B)-CTE(A)| \times \Delta T/L(BA) \quad (3\text{-}A)$$

$$Y \geq CTE(B)-CTE(C)| \times \Delta T/L(BC) \quad (4\text{-}A)$$

A linear expansion coefficient is an index indicating a degree of expansion per 1° C., and therefore, a difference in the degree of expansion of materials of members adjacent to each other at a temperature change ΔT is expressed by multiplying the temperature change ΔT by an absolute value of a linear expansion coefficient difference between the materials of the members adjacent to each other. The degree of expansion of the materials of the adjacent members at the temperature change ΔT can be converted per unit length by dividing the obtained value by an initial contact length of the thermoconductive insulating adhesive film with the adjacent member. It can be said that a fracture elongation of the thermoconductive insulating adhesive film is sufficiently high with respect to a strain length when the fracture elongation of the thermoconductive insulating adhesive film is equal to or greater than this value.

In the present specification, an "initial maximum uniaxial length of a region at which the thermoconductive insulating adhesive film is in contact with an adjacent member" is obtained in an environment of 25° C. A "maximum uniaxial length" is the maximum length in a uniaxial direction in the plane of the contact area, that is, a length of a long axis when a shape of the contact area is substantially rectangular, and a length of a long axis when a shape of the contact area is substantially elliptical, for example. In addition, the term "initial" means before measurement of a fracture elongation.

Expressions (3-B) and (4-B) are obtained from Expressions (3-A) and (4-A).

$$Y/|CTE(B)-CTE(A)| \times L(BA) \geq \Delta T \quad (3\text{-}B)$$

$$Y/|CTE(B)-CTE(C)| \times L(BC) \geq \Delta T \quad (4\text{-}B)$$

In the composite member of the present invention, Expressions (3-B) and (4-B) can be satisfied when ΔT is 50° C. or higher, preferably 100° C. or higher, more preferably 150° C. or higher, and particularly preferably 200° C. or higher.

Specifically, the composite member of the present invention satisfies Expressions (1-0) to (4-0) (where |CTE(B)−CTE(A)|>0 and |CTE(B)−CTE(C)|>0) (corresponding to the condition of ΔT=/50 (° C.)).

$$X/(E \times |CTE(B)-CTE(A)|) \geq 50 \quad (1\text{-}0)$$

$$X/(E \times |CTE(B)-CTE(C)|) \leq 50 \quad (2\text{-}0)$$

$$Y/|CTE(B)-CTE(A)| \times L(BA) \geq 50 \quad (3\text{-}0)$$

$$Y/|CTE(B)-CTE(C)| \times L(BC) \geq 50 \quad (4\text{-}0)$$

The composite member of the present invention can preferably satisfy Expressions (1-1) to (4-1) (corresponding to the condition of ΔT=100 (° C.)).

$$X/(E \times |CTE(B)-CTE(A)|) \geq 100 \quad (1\text{-}1)$$

$$X/(E \times |CTE(B)-CTE(C)|) \geq 100 \quad (2\text{-}1)$$

$$Y/|CTE(B)-CTE(A)| \times L(BA) \geq 100 \quad (3\text{-}1)$$

$$Y/|CTE(B)-CTE(C)| \times L(BC) \geq 100 \quad (4\text{-}1)$$

The composite member of the present invention can preferably satisfy Expressions (1-2) to (4-2) (corresponding to the condition of ΔT=150 (° C.)).

$$X/(E \times |CTE(B)-CTE(A)|) \geq 150 \quad (1\text{-}2)$$

$$X/(E \times |CTE(B)-CTE(C)|) \geq 150 \quad (2\text{-}2)$$

$$Y/|CTE(B)-CTE(A)| \times L(BA) \geq 150 \quad (3\text{-}2)$$

$$Y/|CTE(B)-CTE(C)| \times L(BC) \geq 150 \quad (4\text{-}2)$$

The composite member of the present invention can more preferably satisfy Expressions (1-3) to (4-3) (corresponding to the condition of ΔT=200 (° C.)).

$$X/(E \times |CTE(B)-CTE(A)|) \geq 200 \quad (1\text{-}3)$$

$$X/(E \times |CTE(B)-CTE(C)|) \geq 200 \quad (2\text{-}3)$$

$$Y/|CTE(B)-CTE(A)| \times L(BA) \geq 200 \quad (3\text{-}3)$$

$$Y/|CTE(B)-CTE(C)| \times L(BC) \geq 200 \quad (4\text{-}3)$$

Since the composite member of the present invention satisfies Expressions (1-0) to (4-0), preferably satisfies (1-1) to (4-1), more preferably satisfies (1-2) to (4-2), and particularly preferably satisfies (1-3) to (4-3), generation of cracks and/or peeling of the thermoconductive insulating adhesive film is effectively inhibited, making durability excellent, even when it is used under conditions with large temperature changes (specifically, a temperature change ΔT being 50° C. or higher, 100° C. or higher, 150° C. or higher, or 200° C. or higher).

Selections of a material of the heat dissipating base substrate and a material of a surface of the heat generating member in contact with the thermoconductive insulating adhesive film are limited. Therefore, a linear expansion coefficient, a modulus of elasticity, a fracture elongation, and an adhesive force of the thermoconductive insulating adhesive film need to be set according to linear expansion coefficients of these materials so that Expressions (1-0) to (4-0), preferably (1-1) to (4-1), more preferably (1-2) to (4-2), and particularly preferably (1-3) to (4-3) are satisfied. A method of adjusting a linear expansion coefficient, a modulus of elasticity, a fracture elongation, and an adhesive force of the thermoconductive insulating adhesive film will be described later.

Because the thermoconductive insulating adhesive film has sufficient flexibility and can effectively reduce thermal stress, a modulus of elasticity thereof in a range of greater than or equal to −40° C. and less than 25° C. may be, for example, 10 GPa or less, and a modulus of elasticity thereof in a range of greater than or equal to 25° C. and less than or equal to 200° C. may be, for example, 1 GPa or less. In addition, a modulus of elasticity of the thermoconductive insulating adhesive film in a range of −40° C. to 200° C. may be, for example, 0.1 MPa or more.

A difference in linear expansion coefficient between the thermoconductive insulating adhesive film and the heat dissipating base substrate, and a difference in linear expansion coefficient between the thermoconductive insulating adhesive film and a surface of the heat generating member in contact with the thermoconductive insulating adhesive film are preferably small. A linear expansion coefficient of the thermoconductive insulating adhesive film may be, for example, $10\times10^{-6}$ to $160\times10^{-6}$ (° $C.^{-1}$), more preferably $10\times10^{-6}$ to $120\times10^{-6}$ (° $C.^{-1}$), particularly preferably $10\times10^{-6}$ to $100\times10^{-6}$ (° $C.^{-1}$), and particularly preferably $15\times10^{-6}$ to $80\times10^{-6}$ (° $C.^{-1}$), because selections of a material of the heat dissipating base substrate and a material of the surface of the heat generating member in contact with the thermoconductive insulating adhesive film are limited, and a difference in linear expansion coefficient between the thermoconductive insulating adhesive film and these materials is then reduced. When a linear expansion coefficient of the thermoconductive insulating adhesive film is within such a range, the thermoconductive insulating adhesive film can favorably follow swelling or expansion and contraction caused by temperature changes of the heat dissipating base substrate and the heat generating member, and a thermal stress is effectively reduced.

A fracture elongation of the thermoconductive insulating adhesive film at 25° C. may be, for example, 0.02 or more, more preferably 0.05 or more, and particularly preferably 0.1 or more. When a fracture elongation of the thermoconductive insulating adhesive film is 0.02 or more, the film is unlikely to break due to thermal stress, and generation of cracks is effectively inhibited.

A thermal conductivity of the thermoconductive insulating adhesive film is not particularly limited. An amount of heat generated per unit volume generally increases as an output of a heat generating member such as a power semiconductor element or a power card including the same increases, or as a size of the heat generating member is reduced, and as a result, a higher level of heat dissipation is required. A thermal conductivity of the thermoconductive insulating adhesive film may be, for example, higher, preferably 1 W/m·K or more, and more preferably 3 W/m·K or more.

For example, a thermal conductivity can be calculated back from a heat resistance.

A thermal conductivity can also be obtained from a thermal diffusivity ($mm^2/s$) representing a speed of heat conduction in a sample, a specific heat capacity (J/(g·K)) of the sample, and a density ($g/cm^3$) by the following expression.

Thermal conductivity(W/m·K)=thermal diffusivity ($mm^2$/s)×specific heat capacity (J/(g·K))×density ($g/cm^3$)

Examples of methods of measuring a thermal diffusivity include a periodic heating method, a hot disk method, a temperature wave analysis method, a flash method, and the like. For example, in the case of the flash method, a thermal diffusivity can be measured using a xenon flash analyzer LFA 447 NanoFlash (manufactured by NETZSCH).

It is preferable that an insulation property of the thermoconductive insulating adhesive film be excellent. A dielectric breakdown voltage of the thermoconductive insulating adhesive film may be, for example, high, preferably 0.5 kV or more, more preferably 3 kV or more, and particularly preferably 6 kV or more.

Durability with respect to temperature changes can be evaluated by performing a thermal cycling test. For example, insulation durability can be evaluated by subjecting the composite member to 3,000 thermal cycles of maintaining a temperature at −40° C. for 15 minutes and then maintaining a temperature at 150° C. for 15 minutes using a thermal shock device TSE-12-A manufactured by ESPEC Corp., and measuring a dielectric breakdown voltage before and after the thermal cycling test. The composite member of the present invention can maintain a favorable dielectric breakdown voltage even after being subjected to the above-mentioned thermal cycling test as will be described in the section [Examples] below.

A thickness of the thermoconductive insulating adhesive film is not particularly limited, and may be, for example, 40 to 1100 μm, and more preferably 50 to 1000 μm from the viewpoints of an insulation property, thermal conductivity, handling, and thermal stress relaxation. When a thickness is 40 μm or more, durability and an insulation property tend to be improved. When a thickness is 1100 μm or less, thermal conductivity tends to become favorable.

In the present specification, various parameters are obtained by a method to be described later in the section [Examples] unless otherwise specified.

(Heat Dissipating Base Substrate)

The heat dissipating base substrate is a base substrate for a heat dissipating member such as a heat sink.

Generally, a metal and/or a ceramic is used as a material of the heat dissipating base substrate. Examples thereof include aluminum, copper, iron, tungsten, molybdenum, magnesium, a copper-tungsten alloy, a copper-molybdenum alloy, a copper-tungsten-molybdenum alloy, aluminum nitride, silicon carbide, silicon nitride, and the like. One kind or two or more kinds thereof can be used.

A surface roughness (Ra) of the surface of the heat dissipating base substrate in contact with the thermoconductive insulating adhesive film may be, for example, 0.1 to 2 μm, and more preferably 0.2 to 1.7 μm. When Ra is 0.1 μm or more, adhesiveness between the heat dissipating base substrate and the thermoconductive insulating adhesive film is improved by an anchor effect, thereby improving durability. When Ra is 2 μm or less, surface asperity of the heat dissipating base substrate is low, and an insulation property are improved.

In the present specification, Ra is arithmetic average roughness, and can be measured according to JIS B0601 2001.

Known fins may be attached to the heat dissipating base substrate to increase heat dissipation efficiency. Examples of fins include a straight fin, a wavy fin, an offset fin, a pin fin, a corrugated fin, and the like. These fins may be integrated with the heat dissipating base substrate.

(Heat Generating Member)

The heat generating member includes a heat generating part that can generate heat. Examples of heat generating members include semiconductor packages such as integrated circuits, IC chips, and hybrid packages; semiconductor modules such as multi-modules; various electronic components such as power transistors, power semiconductor elements, power cards including power semiconductor elements, surface resistors, and thermoelectric conversion modules; building materials; members of vehicles, aircraft, ships, or the like; and the like.

The composite member of the present invention is suitable for, for example, the case in which a heat generating member is a power semiconductor module such as a power card including a power semiconductor element.

In a power semiconductor module such as a power card, one or a plurality of power semiconductor elements are mounted on a base substrate of which at least one surface has conductivity (a surface on which the power semiconductor element is mounted) via a bonding agent such as a solder, and these are preferably sealed with a sealing material such as an epoxy resin. A power semiconductor element is a heat generating part in a power semiconductor module such as a power card. In a power semiconductor module such as a power card, a heat dissipating base substrate can be bonded to one or both surfaces of the heat generating part via a thermoconductive insulating adhesive film. In this case, a member of the heat generating member in contact with the thermoconductive insulating adhesive film is a base substrate of which at least a surface has conductivity, and/or a sealing material such as an epoxy resin.

Examples of base substrates in which at least a surface has conductivity include conductive base substrates made of silver, copper, aluminum, nickel, tin, iron, lead, alloys thereof, carbon, or the like. A circuit pattern may be formed on the conductive base substrate. The base substrate in which at least a surface has conductivity may be a base substrate in which a conductive film is formed on a non-conductive base substrate made of a resin, a ceramic, or the like.

A surface roughness (Ra) of the surface of the heat generating member in contact with the thermoconductive insulating adhesive film may be, for example, 0.1 to 2 µm, and more preferably 0.2 to 1.7 µm, because then adhesiveness between the heat generating member and the thermoconductive insulating adhesive film is improved, and thereby durability is improved. When Ra is 0.1 µm or more, adhesiveness between the heat generating member and the thermoconductive insulating adhesive film is improved by an anchor effect, thereby improving durability. When Ra is 2 µm or less, surface asperity of the heat generating member is low, and an insulation property is improved.

(Thermoconductive Insulating Adhesive Film)

Any thermoconductive insulating adhesive film can be used as long as it has thermal conductivity and an insulation property, and can satisfactorily bond the heat dissipating base substrate and the heat generating member with each other. The thermoconductive insulating adhesive film preferably includes a thermoconductive insulating filler and a binder resin because then high thermal conductivity can be exhibited.

The thermoconductive insulating filler is not particularly limited, and examples thereof include metal oxides such as aluminum oxide, calcium oxide, and magnesium oxide; metal nitrides such as aluminum nitride and boron nitride; metal hydroxides such as aluminum hydroxide and magnesium hydroxide; metal carbonates such as calcium carbonate and magnesium carbonate; metal silicates such as calcium silicate; hydrated metal compounds; crystalline silica, amorphous silica, silicon carbide, and composites thereof; and the like. These can be used alone or in a combination of two or more kinds thereof. Among them, alumina, aluminum nitride, boron nitride, and the like are preferable.

A form of the thermoconductive insulating filler is not particularly limited, and examples thereof include primary particles, granules obtained by granulating primary particles, aggregates thereof, and combinations thereof.

The thermoconductive insulating filler preferably contains a boron nitride filler having high thermal conductivity. A boron nitride filler generally has poor wettability or an irregular shape, and therefore, in a case where only a boron nitride filler is used as the thermoconductive insulating filler, voids tend to be formed inside. From the viewpoints of high thermal conductivity and low porosity, the thermoconductive insulating filler preferably contains a thermoconductive spherical filler excluding boron nitride, and a boron nitride filler.

In the present specification, the term "spherical" can be represented by, for example, "circularity." The "circularity" can be obtained from the expression: (circularity)=$4\pi S/L^2$ when an arbitrary number of particles is selected from a photograph of the particles taken by a scanning electron microscope (SEM) or the like, and an area of the particles is set to S, and a peripheral length is set to L. In the present specification, unless otherwise specified, "spherical particles" are particles having an average circularity of 0.9 to 1 when an average circularity of particles is measured using a flow-type particle image analyzer FPIA-1000 manufactured by Toa Medical Electronics Co., Ltd. An average circularity may be, for example, 0.96 to 1.

The type of the thermoconductive spherical filler is not particularly limited as long as it is other than boron nitride and has thermal conductivity. Examples thereof include metal oxides such as alumina, calcium oxide, magnesium oxide, crystalline silica, and amorphous silica; metal nitrides such as aluminum nitride; metal hydroxides such as hydroxylaluminum and hydroxylmagnesium; metal carbides such as silicon carbide; metal carbonates such as calcium carbonate and magnesium carbonate; metal silicates such as calcium silicate; hydrated metal compounds; combinations thereof; and the like. These can be used alone or in combination of two or more kinds thereof.

From the viewpoints of a degree of sphericity, thermal conductivity, and an insulation property, the thermoconductive spherical filler may be, for example, selected from the group consisting of alumina and aluminum nitride.

The binder resin is not particularly limited. Examples thereof include a polyurethane resin, a polyester resin, a polyester urethane resin, an alkyd resin, a butyral resin, an acetal resin, a polyamide resin, an acrylic resin, a styrene-acryl resin, a styrene resin, nitrocellulose, benzylcellulose, cellulose (tri)acetate, casein, shellac, gilsonite, gelatin, a styrene-maleic anhydride resin, a polybutadiene resin, a polyvinyl chloride resin, a polyvinylidene chloride resin, a polyvinylidene fluoride resin, a polyvinyl acetate resin, an ethylene vinyl acetate resin, a vinyl chloride/vinyl acetate copolymer resin, a vinyl chloride/vinyl acetate/maleic acid copolymer resin, a fluororesin, a silicone resin, an epoxy resin, a phenoxy resin, a phenolic resin, a maleic acid resin, an urea resin, a melamine resin, a benzoguanamine resin, a ketone resin, a petroleum resin, rosin, rosin ester, polyvinyl alcohol, polyvinyl pyrrolidone, polyacrylamide, hydroxyethyl cellulose, hydroxypropyl cellulose, methyl cellulose, ethyl cellulose, hydroxyethyl methyl cellulose, hydroxypropyl methyl cellulose, carboxymethyl cellulose, carboxymethylethyl cellulose, carboxymethylnitrocellulose, an ethylene/vinyl alcohol resin, a polyolefin resin, a chlorinated polyolefin resin, a modified chlorinated polyolefin resin, a chlorinated polyurethane resin, polyurethane polyurea resin, and the like. For the binder resin, one kind may be used alone or two or more kinds thereof may be used in combination.

Among them, a polyurethane resin and a polyamide resin are preferably used from the viewpoint of flexibility, and an epoxy resin and the like are preferably used from the viewpoint of an insulation property and heat resistance when it is used as an electronic component.

As the binder resin, it is possible to use a resin that is cured by itself or reacts with an appropriate curing agent to be cured.

For example, when the binder resin has a reactive group such as a carboxy group, an amino group, and a phenolic hydroxyl group, as a curing agent capable of reacting with the reactive group, it is preferable to use a difunctional or higher functional epoxy group-containing compound, a difunctional or higher functional isocyanate group-containing compound, a difunctional or higher functional carbodiimide group-containing compound, a difunctional or higher functional metal chelate compound, a difunctional or higher functional metal alkoxide compound, a difunctional or higher functional metal acylate compound, and the like.

The thermoconductive insulating adhesive film may contain a flame retardant, a filler, and other various additives as needed, as long as the effects of the present invention are not impaired. Examples of flame retardants include aluminum hydroxide, magnesium hydroxide, a phosphoric acid compound, and the like. Examples of other additives include a coupling agent for improving adhesiveness of a substrate, an ion scavenger and an antioxidant for improving reliability at the time of moisture absorption or at high temperature, a leveling agent, and the like.

The thermoconductive insulating adhesive film may be, for example, formed by disposing a thermoconductive insulating sheet having a thermoconductive insulating filler and an uncured product and/or semi-cured product of a binder resin which is a thermosetting resin between a heat dissipating member and a heat generating member, and performing curing through heating and pressing. In this case, the thermoconductive insulating adhesive film may include a thermoconductive insulating filler and a cured product of a thermosetting resin.

In the present specification, in a case of using a plurality of types of thermosetting resins having functional groups that can react with each other, a thermosetting resin of a larger amount may be referred to as a main agent, and a thermosetting resin of a smaller amount may be referred to as a curing agent.

The thermoconductive insulating sheet can be obtained by, for example, the following method.

A coating liquid comprising a thermoconductive insulating filler, a binder resin, a solvent, and other optional components as necessary is prepared and applied to a peelable sheet, thereafter the solvent is volatilized and dried, and thereby a thermoconductive insulating sheet to which a peelable sheet is attached can be obtained. The peelable sheet is peeled off when using the thermoconductive insulating sheet.

The coating liquid can be produced by mixing and stirring a thermoconductive insulating filler, a binder resin, a solvent, and other optional components as needed. A stirring mixer is not particularly limited, and examples thereof include a disperser, a mixer, a kneader, a scandex, a paint conditioner, a sand mill, a mortar machine, a media-less disperser, a three-roll mill, a bead mill, and the like. After stirring and mixing, it is preferable to carry out a defoaming step to remove bubbles from the coating liquid. A defoaming method is not particularly limited, and examples thereof include vacuum defoaming, ultrasonic defoaming, and the like.

Examples of peelable sheets include sheets obtained by subjecting a plastic film such as a polyester film, a polyethylene film, a polypropylene film, and a polyimide film to a release treatment.

A method of applying a coating liquid to a peelable sheet is not particularly limited. Examples thereof include knife coating, blade coating, comma coating, die coating, lip coating, roll coating, curtain coating, bar coating, gravure coating, flexo coating, dip coating, spray coating, screen coating, spin coating, a method of using a dispenser, inkjet printing, and the like.

By laminating a plurality of types of thermoconductive insulating sheets having a single-layer structure obtained by the above method and pressing them at a temperature that does not allow complete cure, it is possible to obtain a thermoconductive insulating sheet having the laminate structure in which the type and/or a concentration of a thermoconductive insulating filler, and/or the type and/or a concentration of a binder resin changes in a thickness direction. By using such a thermoconductive insulating sheet having a laminate structure, it is possible to obtain a thermoconductive insulating adhesive film having a laminate structure in which the type and/or a concentration of a thermoconductive insulating filler, and/or the type and/or a concentration of a binder resin changes in a thickness direction.

Preferable examples of laminate configuration of the thermoconductive insulating adhesive film include a configuration in which two or more thermoconductive layers (A) comprising a thermoconductive insulating filler at a relatively low density, and one or more thermoconductive layers (B) comprising a thermoconductive insulating filler at a relatively high density are alternately laminated such that the thermoconductive layers (A) is on the outermost layer for improving flexibility and adhesiveness. In such a laminate structure, the thermoconductive layer (A) as the outermost layer secures adhesiveness and bonding properties with respect to the heat dissipating base substrate and the heat generating member, and the thermoconductive layer (B) secures high thermal conductivity.

The thermoconductive insulating adhesive film can be obtained by disposing the thermoconductive insulating sheet having a single-layer structure or a laminate structure between the heat dissipating member and the heat generating member, and applying heat and pressure thereto. A void is reduced by heating and pressing, and thereby thermal conductivity and an insulation property are improved. In a case where the thermoconductive insulating sheet contains a thermosetting resin, a curing reaction occurs by heating and pressing, and thereby cohesive force of the thermoconductive insulating adhesive film is improved, and adhesive force and durability are improved. The thermoconductive insulating adhesive film may be formed using a plurality of thermoconductive insulating sheets.

A linear expansion coefficient, a modulus of elasticity, a fracture elongation, and adhesive force of the thermoconductive insulating adhesive film can be adjusted according to the type of binder resin, a molecular weight of the binder resin, a ratio of the curing agent, a composition of the thermoconductive insulating sheet such as the type and amount of the thermoconductive insulating filler, and the heating and pressing conditions of the thermoconductive insulating sheet.

(Embodiment of Composite Member)

Structures of composite members of first to fifth embodiments according to the present invention will be described with reference to the drawings. FIGS. 1 to 5 are schematic cross-sectional views, and the same components are denoted by the same reference numerals.

In a composite member 1 of the first embodiment shown in FIG. 1, a heat dissipating base substrate 30 is bonded to one surface of a heat generating member 10 such as a power semiconductor element via a thermoconductive insulating adhesive film 20.

Figure 2:
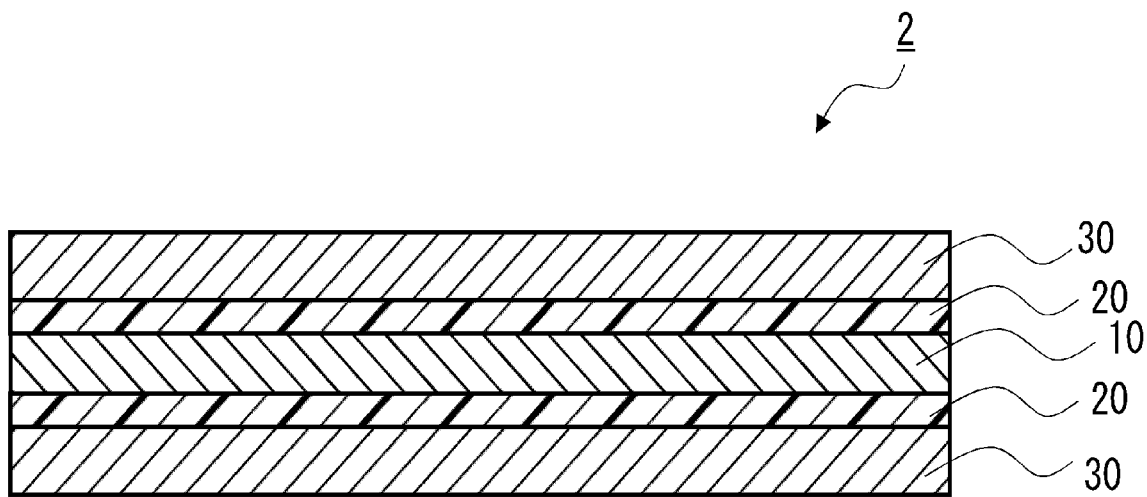
FIG. 2 is a schematic cross-sectional view of a composite member according to a second embodiment of the present invention.

In a composite member 2 of the second embodiment shown in FIG. 2, a heat dissipating base substrate 30 is bonded to both surfaces of a heat generating member 10 such as a power semiconductor element via a thermoconductive insulating adhesive film 20.

Almost the entire part of the heat generating member 10 is a heat generating part in the composite members 1 and 2.

Figure 3:
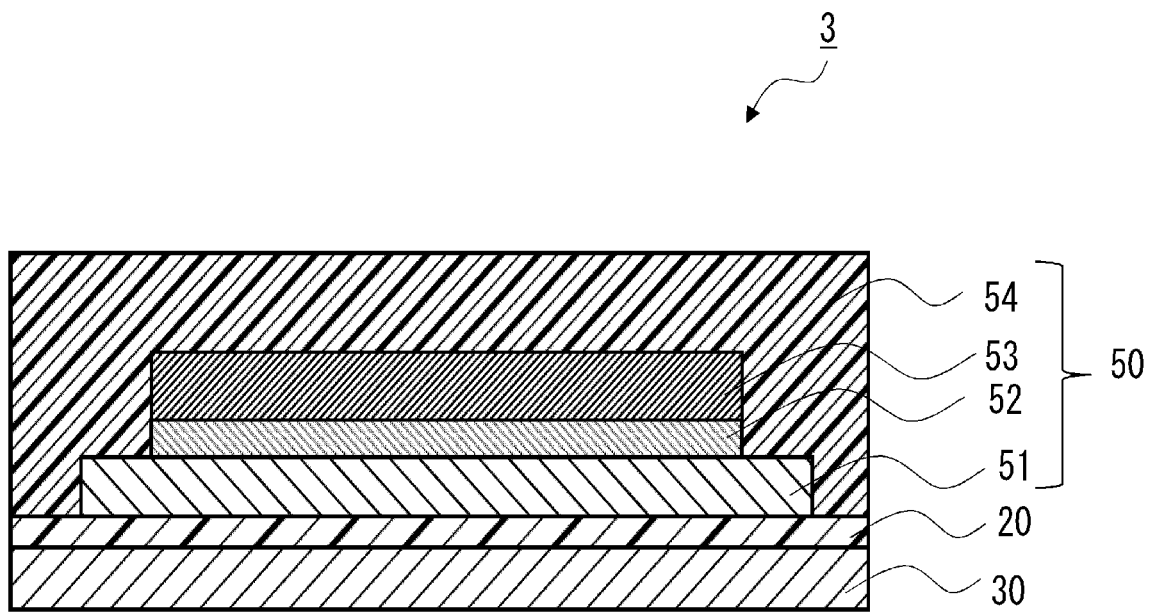
FIG. 3 is a schematic cross-sectional view of a composite member according to a third embodiment of the present invention.
Figure 4:
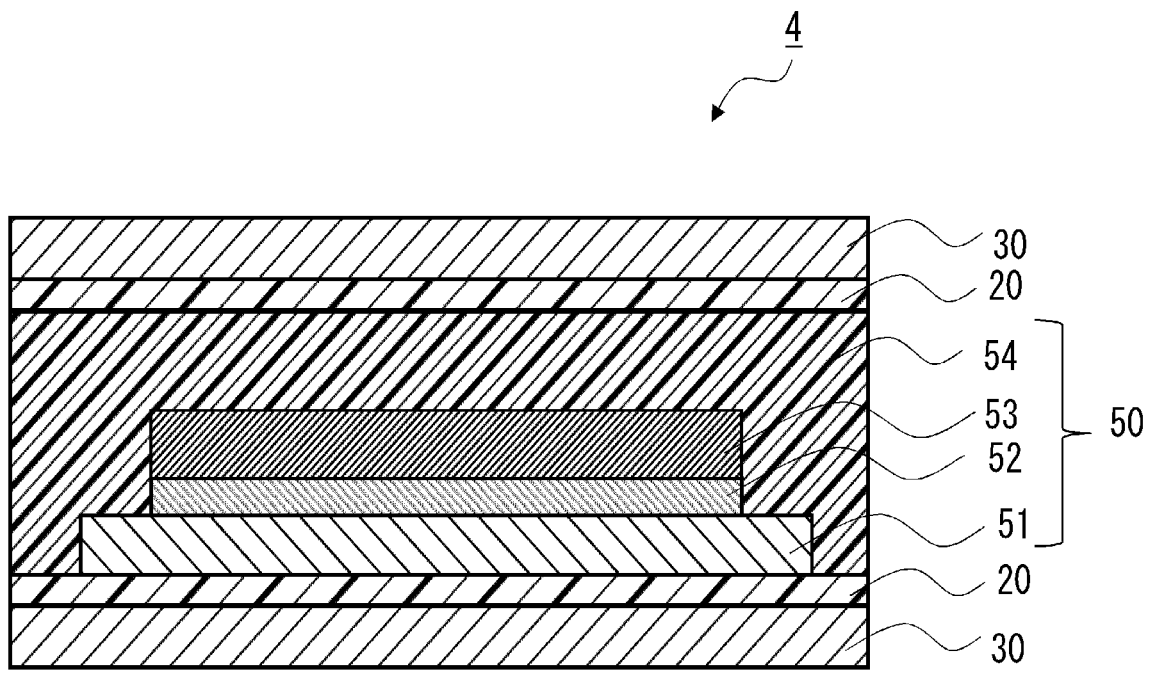
FIG. 4 is a schematic cross-sectional view of a composite member according to a fourth embodiment of the present invention.

In FIGS. 3 and 4, reference numeral 50 denotes a power semiconductor module (a heat generating member) such as a power card including a power semiconductor element. In a power semiconductor module 50, a power semiconductor element 53 is mounted, via a solder layer 52, on a base substrate 51, such as a metal base substrate, of which at least a surface (a surface on which the power semiconductor element is mounted) has conductivity, and these are sealed by a sealing material 54 such as an epoxy resin. The power semiconductor element 53 is a heat generating part in the power semiconductor module 50. A plurality of power semiconductor elements 53 may be mounted on the base substrate 51.

In a composite member 3 of the third embodiment shown in FIG. 3, a heat dissipating base substrate 30 is bonded to one surface of the power semiconductor module 50 (a surface on which the base substrate 51 is not mounted) via a thermoconductive insulating adhesive film 20. In the example shown in FIG. 3, the thermoconductive insulating adhesive film 20 and the heat dissipating base substrate 30 are disposed on the base substrate 51 side, but they may be disposed on the sealing material 54 side.

In a composite member 4 of the fourth embodiment shown in FIG. 4, a heat dissipating base substrate 30 is bonded to both surfaces of the power semiconductor module 50 via a thermoconductive insulating adhesive film 20.

Figure 5:
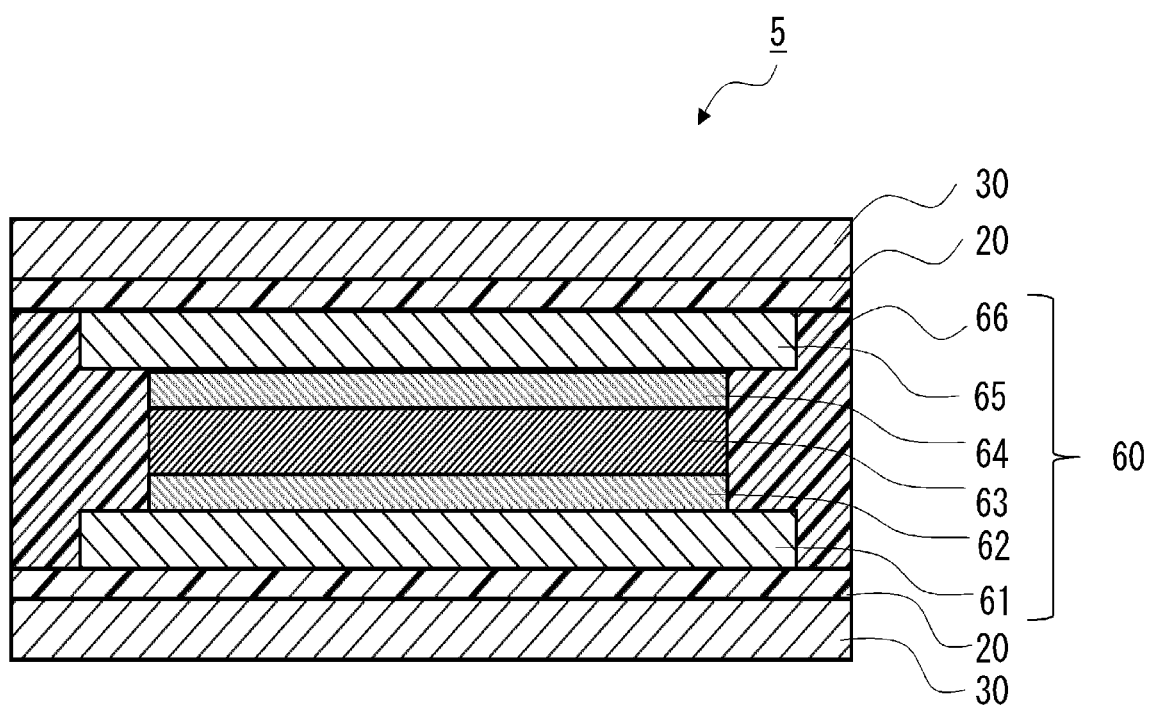
FIG. 5 is a schematic cross-sectional view of a composite member according to a fifth embodiment of the present invention.

In FIG. 5, reference numeral 60 denotes a power semiconductor module (a heat generating member) such as a power card including a power semiconductor element. In the power semiconductor module 60, a power semiconductor element 63 is mounted, via a first solder layer 62, on a first base substrate 61, such as a metal base substrate, of which at least one surface (a surface on the power semiconductor element side) has conductivity. A second base substrate 65, such as a metal base substrate, of which at least one surface (a surface on the power semiconductor element side) has conductivity is bonded on this power semiconductor element 63 via a second solder layer 64, and these are sealed by a sealing material 66 such as an epoxy resin. The power semiconductor element 63 is a heat generating part in the power semiconductor module 60. A plurality of power semiconductor elements 63 may be mounted on the first base substrate 61.

In a composite member 5 of the fifth embodiment shown in FIG. 5, a heat dissipating base substrate 30 is bonded to both surfaces of the power semiconductor module 60 via a thermoconductive insulating adhesive film 20.

Designs of the composite members shown in FIGS. 1 to 5 can be appropriately changed.

As described above, according to the present invention, it is possible to provide a composite member that has a structure in which a heat dissipating base substrate is bonded to at least one surface of a heat generating member including a heat generating part capable of generating heat via a thermoconductive insulating adhesive film, the composite member having excellent durability and in which generation of cracks and/or peeling of the thermoconductive insulating adhesive film is effectively inhibited even when being used under conditions of a large temperature change.

EXAMPLES

Hereinafter, examples and comparative examples according to the present invention will be described. In the section [Examples], "parts" and "%" respectively represent "parts by mass" and "% by mass" unless otherwise specified. RH represents a relative humidity.

[Evaluation Items and Evaluation Methods for Each Member]

(Linear Expansion Coefficient)

Values in literature were used for materials with known linear expansion coefficients, such as metal. A linear expansion coefficient was obtained by the following method for materials with unknown linear expansion coefficients, such as a thermoconductive insulating adhesive film.

Using TMA Q400 manufactured by TA Instruments, the displacement in a striped sample having a width of 4 mm and a length of 20 mm was measured when a heating load was applied at a rate of temperature increase of 10° C./min from −40° C. to 180° C. with a load of 5 g. A linear expansion coefficient was obtained by averaging a slope between −40° C. and 150° C. when plotting a sample temperature on a horizontal axis and the displacement on a vertical axis.

(Modulus of Elasticity and Fracture Elongation)

A thermoconductive insulating sheet for forming a thermoconductive insulating adhesive film was sandwiched between two peelable sheets, and heat press was performed thereon under the same heating and pressing conditions as for the production of test pieces for composite members (heating and pressing conditions of 150° C. for 60 minutes at 3 MPa, or heating and pressing conditions of 150° C. for 60 minutes at 1 MPa). Thereafter, the two peelable sheets were peeled off, and thereby a single body of a thermoconductive insulating adhesive film was obtained. A striped sample having a width of 10 mm and a length of 50 mm was cut out from the single body of the thermoconductive insulating adhesive film. Using TENSILON RTE-1210 manufactured by Orientec Co., Ltd., both ends of the sample were gripped with a pair of chucks, and measurement was performed under atmospheres of 25° C.-50% RH, −40° C., and 175° C. at a tensile speed of 2 mm/min. A distance between the pair of chucks at the start of the test was 25 mm.

A modulus of elasticity was calculated using the obtained measurement values in accordance with JIS-K7161: 1994. In addition, a length when the sample was broken was obtained, and a fracture elongation was obtained from the following expression. An initial length was 25 mm (the distance between the pair of chucks at the start of the test).

Fracture elongation=((length when the sample was broken)−(initial length))/(initial length)

[Evaluation Items and Evaluation Methods for Fillers]

(Average Particle Diameter)

An average particle diameter of a filler was measured using a particle size distribution analyzer, Mastersizer 2000 manufactured by Malvern Instruments. In the measurement, a dry unit was used, and an air pressure was 2.5 bar. A feed speed was optimized depending on samples.

[Evaluation Items and Evaluation Methods for Resin Solution]

(Solid Content)

1 g of the resin solution was weighed and put in a thin metal container with a lid, a residual amount after heating in an oven at 200° C. for 20 minutes was measured, and a solid content was obtained by the following expression.

Solid content (% by mass)=(residual amount(g)/1 g)×100

(Weight-Average Molecular Weight (MW))

A Mw was measured using a gel permeation chromatography (GPC) "HLC8220GPC" manufactured by TOSOH CORPORATION. GPC is a liquid chromatography in which substances dissolved in a solvent (THF; tetrahydrofuran) are separated and quantified according to a difference in molecular size.

The measurement was carried out using two "TOSOH TSKgel Super HZM-N" (manufactured by TOSOH CORPORATION) connected in series as columns under conditions of a sample concentration of 0.1% by mass, a flow rate of 0.34 ml/min, a pressure of 7.4 MPa, and a column temperature of 40° C., and a Mw in terms of polystyrene was obtained. Creation of a calibration curve, and calculation of a molecular weight and a peak area were performed using built-in software, and a Mw was obtained with a retention time within the range of 5 to 9.85 minutes as an analysis target.

(Viscosity)

10 g of the resin solution was put in a glass screw tube, and was left to stand in a constant-temperature tank at 25° C. overnight. Thereafter, a viscosity was measured under conditions of a rotor No. 4 and a rotation speed of 30 rpm using a B-type viscometer (TVB-15 manufactured by TOKI SANGYO CO., LTD).

[Thermoconductive Insulating Filler]

Thermoconductive insulating fillers used are as follows.

(Thermoconductive Spherical Filler)

AO509: Spherical alumina having an average particle diameter of 10 μm (ADMAFINE AO-509 manufactured by Admatechs), CB-A20S: Spherical alumina having an average particle diameter of 20 μm (ALUNABEADS CB-A20S manufactured by Showa Denko K. K.), DAW-45: Spherical alumina having an average particle diameter of 45 μm (DAW-45 manufactured by Denka Company Limited), and A30: Spherical alumina having an average particle diameter of 30 μm (ALUNABEADS CB-A30S manufactured by Showa Denko K. K.)

(Boron Nitride Filler)

PTX60: Granulated boron nitride filler having an average particle diameter of 55 to 65 μm (PTX-60 manufactured by Momentive), PTX25: Granulated boron nitride filler having an average particle diameter of 25 μm (PTX-25 manufactured by Momentive), agg100: Granulated boron nitride filler having an average particle diameter of 65 to 85 μm (Agglomerates 100 manufactured by 3M Japan Ltd.), and agg50: Granulated boron nitride filler having an average particle diameter of 15 to 30 μm (Agglomerates 50 manufactured by 3M Japan Ltd.)

Synthesis Example 1

Synthesis of Solution of Polyurethane Polyurea Resin (Resin R1)

401.9 parts of a polyester polyol ("Kuraray polyol P-1011" manufactured by Kuraray Co., Ltd., Mn=1006) obtained from terephthalic acid, adipic acid, and 3-methyl-1,5-pentanediol, 12.7 parts of dimethylolbutanoic acid, 151.0 parts of isophorone diisocyanate, and 40 parts of toluene were put in a reaction vessel having a stirrer, a thermometer, a reflux condenser, a dropping device, and a nitrogen introduction pipe, and were reacted at 90° C. for 3 hours under a nitrogen atmosphere. 300 parts of toluene was added thereto, and thereby a urethane prepolymer solution having an isocyanate group was obtained.

Next, 815.1 parts of the obtained urethane prepolymer solution having an isocyanate group was added to a solution obtained by mixing 27.8 parts of isophoronediamine, 3.2 parts of di-n-butylamine, 342.0 parts of 2-propanol, and 396.0 parts of toluene, and reacted at 70° C. for 3 hours. After completion of the reaction, the reaction mixture was diluted with a mixed solvent of 144.0 parts of toluene and 72.0 parts of 2-propanol. As described above, a solution of a thermosetting polyurethane polyurea resin (resin R1) having a solid content of 30% by mass, a Mw of 120,000, and a viscosity of 3,000 mPa·s was obtained.

Synthesis Example 2

Synthesis of Solution of Polyamide Resin (Resin R2)

70.78 parts of Pripol 1009 (manufactured by Croda Japan KK) as a polybasic acid compound having 36 carbon atoms, 5.24 parts of 5-hydroxyisophthalic acid (manufactured by Sugai Chemical Industry Co., Ltd.; hereinafter, also referred to as "5-HIPA") as a polybasic acid compound having a phenolic hydroxyl group, 82.84 parts of Priamine 1074 (manufactured by Croda Japan KK) as a polyamine compound having 36 carbon atoms, and 4.74 parts of toluene were put in a four-necked flask having a stirrer, a reflux condenser to which a distilling receiver for water content is attached, a nitrogen introduction pipe, and a thermometer. A temperature was raised to 220° C. while stirring the mixture and checking outflow of water, and the dehydration reaction was continued. Sampling was performed every hour, and when a Mw was checked and became 40,000, the mixture was sufficiently cooled. Thereafter, 40 parts of cyclohexanone, 91.34 parts of toluene, and 96.12 parts of isopropyl alcohol were added thereto as a diluting solvent and fully dissolved. In this manner, a solution of a phenolic hydroxyl group-containing polyamide resin (resin R2) having a solid content of 40.2% by mass, a Mw of 41,038, and a viscosity of 9,580 mPa·s was obtained.

Synthesis Example 3

Synthesis of Solution of Polyamide Resin (Resin R3)

70.99 parts of Pripol 1009 (manufactured by Croda Japan KK) as a polybasic acid compound having 36 carbon atoms, 5.24 parts of 5-hydroxyisophthalic acid (5-HIPA) as a polybasic acid compound having a phenolic hydroxyl group, 83.77 parts of Priamine 1074 (manufactured by Croda Japan KK) as a polyamine compound having 36 carbon atoms, and 4.2 parts of xylene were put in a four-necked flask having a stirrer, a reflux condenser to which a distilling receiver for water content is attached, a nitrogen introduction pipe, and a thermometer. A temperature was raised to 220° C. while stirring and while checking outflow of water, and the dehydration reaction was continued. Sampling was performed every hour, and when a Mw was checked and became 45,000, the mixture was sufficiently cooled. Thereafter, 112.5 parts of toluene and 112.5 parts of isopropyl alcohol were added thereto as a diluting solvent and fully dissolved at 75° C. In this manner, a solution of a phenolic hydroxyl group-containing polyamide resin (resin R3) having a solid content of 40.5% by mass, a Mw of 45,251, and a viscosity of 22,750 mPa·s was obtained.

Production Example 1

Production of Thermoconductive Insulating Sheet (S-1)

The resin R1, CB-A20S as an alumina filler, and PTX60 as a boron nitride filler were mixed. A mixing ratio was as follows: 40% by volume of resin R1, 45% by volume of CB-A205, and 15% by volume of PTX60. In addition, a 50% toluene solution of Epikote 1001 as a curing agent (manufactured by Japan Epoxy Resins Co., Ltd.) was added to the mixture such that an amount thereof became 2% with respect to the resin in terms of solid content, and the mixture was adjusted with toluene such that a total solid content became 50%. Next, the obtained coating liquid was applied on a peelable sheet such that a film thickness after drying became 50 μm, and was dried. In this manner, a sheet (A'-1) comprising two types of thermoconductive insulating fillers and an uncured binder resin on the peelable sheet was obtained. Two sets of these were prepared.

Separately, the resin R1, DAW-45 as an alumina filler, and PTX60 as a boron nitride filler were mixed. A mixing ratio was as follows: 40% by volume of resin R1, 10% by volume of DAW-45, and 50% by volume of PTX60. In addition, a 50% toluene solution of Epikote 1001 as a curing agent (manufactured by Japan Epoxy Resins Co., Ltd.) was added to the mixture such that an amount thereof became 2% with respect to the resin in terms of solid content, and the mixture was adjusted with toluene such that a total solid content became 50%. Next, the obtained coating liquid was applied on a peelable sheet such that a film thickness after drying became 100 μm, and was dried. In this manner, a sheet (B'-1) comprising two types of thermoconductive insulating fillers and an uncured binder resin on the peelable sheet was formed.

The two sheets (A'-1) attached with a peelable sheet and the one sheet (B'-1) attached with a peelable sheet which were obtained above were laminated in a laminated structure of peelable sheet/sheet (A'-1)/sheet (B'-1)/sheet (A'-1)/peelable sheet. This laminate was roll-laminated under conditions of a pair of roll temperatures of 80° C., a lamination pressure of 1.5 MPa, and a speed of 0.5 m/min. Thereafter, two peelable sheets were peeled off, and thereby a thermoconductive insulating sheet (S-1) having a three-layer structure for formation of a thermoconductive insulating adhesive film was obtained.

Production Example 2

Production of Thermoconductive Insulating Sheet (S-2)

A sheet (A'-2) was formed on a peelable sheet in the same manner as in the sheet (A'-1) of Production Example 1 except that the resin R1 was changed to the resin R2, and the curing agent was changed to TETRAD-X (a 5% toluene solution, manufactured by MITSUBISHI GAS CHEMICAL COMPANY, INC.).

A sheet (B'-2) was formed on a peelable sheet in the same manner as in the sheet (B'-1) of Production Example 1 except that the resin R1 was changed to the resin R2, and the curing agent was changed to TETRAD-X (a 5% toluene solution, manufactured by MITSUBISHI GAS CHEMICAL COMPANY, INC.).

In the same manner as in Production Example 1, a laminate of peelable sheet/sheet (A'-2)/sheet (B'-2)/sheet (A'-2)/peelable sheet was obtained, the laminate was roll-laminated, the two peelable sheets were peeled off, and thereby a thermoconductive insulating sheet (S-2) having a three-layer structure for formation of a thermoconductive insulating adhesive film was obtained.

Production Example 3

Production of Thermoconductive Insulating Sheet (S-3)

A sheet (A'-3) was formed on a peelable sheet in the same manner as in the sheet (A'-2) of Production Example 2 except that an amount of the resin R2 added was changed to 45% by volume, 45% by volume of AO509 was used as an alumina filler, and 10% by volume of agg100 was used as a boron nitride filler.

A sheet (B'-3) was formed on a peelable sheet in the same manner as in the sheet (B'-2) of Production Example 2 except that an amount of the resin R2 added was changed to 45% by volume, A30 was used as an alumina filler, and an amount of PTX60 added was changed to 45% by volume.

In the same manner as in Production Example 2, a laminate of peelable sheet/sheet (A'-3)/sheet (B'-3)/sheet (A'-3)/peelable sheet was obtained, the laminate was roll-laminated, the two peelable sheets were peeled off, and thereby a thermoconductive insulating sheet (S-3) having a three-layer structure for formation of a thermoconductive insulating adhesive film was obtained.

Production Example 4

Production of Thermoconductive Insulating Sheet (S-4)

A sheet (A'-4) was formed on the peelable sheet in the same manner as in the sheet (A'-2) of Production Example 2 except that an amount of the curing agent added was changed to 10% by mass with respect to the resin in terms of solid content.

A sheet (B'-4) was formed on the peelable sheet in the same manner as in the sheet (B'-2) of Production Example 2 except that an amount of the curing agent added was changed to 10% by mass with respect to the resin in terms of solid content.

In the same manner as in Production Example 2, a laminate of peelable sheet/sheet (A'-4)/sheet (B'-4)/sheet (A'-4)/peelable sheet was obtained, the laminate was roll-laminated, the two peelable sheets were peeled off, and thereby a thermoconductive insulating sheet (S-4) having a three-layer structure for formation of a thermoconductive insulating adhesive film was obtained.

Production Example 5

Production of Thermoconductive Insulating Sheet (S-5)

A sheet (A'-5) was formed on the peelable sheet in the same manner as in the sheet (A'-2) of Production Example 2 except that the resin R2 was changed to the resin R3, and an amount of the curing agent added was changed to 10% by mass with respect to the resin in terms of solid content.

A sheet (B'-5) was formed on the peelable sheet in the same manner as in the sheet (B'-2) of Production Example 2 except that the resin R2 was changed to the resin R3, and an amount of the curing agent added was changed to 10% by mass with respect to the resin in terms of solid content.

In the same manner as in Production Example 2, a laminate of peelable sheet/sheet (A'-5)/sheet (B'-5)/sheet (A'-5)/peelable sheet was obtained, the laminate was roll-laminated, the two peelable sheets were peeled off, and thereby a thermoconductive insulating sheet (S-5) having a three-layer structure for formation of a thermoconductive insulating adhesive film was obtained.

Production Example 6

Production of Thermoconductive Insulating Sheet (S-6)

The resin R1 and A0509 as an alumina filler were mixed. A mixing ratio was as follows: 30% by volume of the resin R1 was and 70% by volume of the alumina filler. In addition, a 50% toluene solution of Epikote 1001 as a curing agent (manufactured by Japan Epoxy Resins Co., Ltd.) was added to the mixture such that an amount thereof became 2% with respect to the resin in terms of solid content, and the mixture was adjusted with toluene such that a total solid content became 50%. Next, the obtained coating liquid was applied on a peelable sheet such that a film thickness after drying became 100 μm, and was dried. In this manner, a thermoconductive insulating sheet (S-6) having a single layer structure and comprising one type of thermoconductive insulating filler and an uncured binder resin on the peelable sheet was formed.

Production Example 7

Production of Thermoconductive Insulating Sheet (S-7)

A thermoconductive insulating sheet (S-7) having a single layer structure and comprising one type of thermoconductive insulating filler and an uncured binder resin on the peelable sheet was formed in the same manner as in Production Example 6 except that an amount of the resin R1 added was changed to 55% by volume and an amount of the alumina filler added was changed to 45% by volume.

Production Example 8

Production of Thermoconductive Insulating Sheet (S-8)

A thermoconductive insulating sheet (S-8) having a single layer structure and comprising one type of thermoconductive insulating filler and an uncured binder resin on the peelable sheet was formed in the same manner as in Production Example 6 except that 25% by volume of the resin R2 was used as a resin, and 75% by volume of the boron nitride filler, PTX25 was used instead of the alumina filler.

Production Example 9

Production of Thermoconductive Insulating Sheet (S-9)

A sheet (A'-9) was formed on a peelable sheet in the same manner as in the sheet (A'-2) of Production Example 2 except that an amount of the resin R2 added was changed to 45% by volume, 35% by volume of AO509 was used as an alumina filler, and 20% by volume of agg50 was used as a boron nitride filler.

A sheet (B'-9) was formed on a peelable sheet in the same manner as in the sheet (B'-2) of Production Example 2 except that an amount of the resin R2 added was changed to 50% by volume, an alumina filler was not used, and an amount of PTX60 added was changed to 50% by volume.

In the same manner as in Production Example 2, a laminate of peelable sheet/sheet (A'-9)/sheet (B'-9)/sheet (A'-9)/peelable sheet was obtained, the laminate was roll-laminated, the two peelable sheets were peeled off, and thereby a thermoconductive insulating sheet (S-9) having a three-layer structure for formation of a thermoconductive insulating adhesive film was obtained.

Production Example 10

Production of Thermoconductive Insulating Sheet (S-11)

A thermoconductive insulating sheet (S-11) having a single layer structure and comprising one type of thermoconductive insulating filler and an uncured binder resin on the peelable sheet was formed in the same manner as in Production Example 6 except that the resin R1 was changed to a mixed resin R4 of an epoxy group-containing styrene resin, G-1010S (manufactured by NOF CORPORATION)/a crystalline biphenyl skeleton epoxy resin, YX-4000 (manufactured by Mitsubishi Chemical Corporation)/a bisphenol A type liquid epoxy resin, Epikote 828US (manufactured by Mitsubishi Chemical Corporation) (mass ratio: 35/50/5), and 2% by mass of a mixture of dicyandiamide and 2MZA-PW (manufactured by SHIKOKU CHEMICALS CORPORATION) (mass ratio: 60/40) as a curing agent was used with respect to the resin in terms of solid content.

Production Example 11

Production of Thermoconductive Insulating Sheet (S-12)

A thermoconductive insulating sheet (S-12) having a single layer structure and comprising one type of thermoconductive insulating filler and an uncured binder resin on the peelable sheet was formed in the same manner as in Production Example 10 except that an amount of the curing agent added was changed to 5% with respect to the resin in terms of solid content.

Examples 1 to 11 and Comparative Examples 1 and 2

In each of Examples 1 to 11 and Comparative Examples 1 and 2, a heat dissipating base substrate (width 25 mm, length 100 mm, thickness 2 mm) having a material and a linear expansion coefficient shown in Table 1; a thermoconductive insulating sheet shown in Table 1; and a member (width 25 mm, length 100 mm, thickness 2 mm) of the heat generating member having a material and a linear expansion coefficient shown in Table 1, the member in contact with the thermoconductive insulating adhesive film, were overlapped. A heat press was performed thereon under heating and pressing conditions shown in Table 1, and thereby a test piece of a composite member was obtained. A size of a portion of the thermoconductive insulating sheet sandwiched between the upper and lower members was 25 mm in width and 40 mm in length. This "length of 40 mm" is the initial maximum uniaxial length.

A heat press was performed using the thermoconductive insulating sheet used to form the thermoconductive insulating adhesive film under the heating and pressing conditions shown in Table 1. Table 1 shows evaluation results of fracture elongation and linear expansion coefficient of the single body of the obtained thermoconductive insulating adhesive film. Table 1 shows other main production conditions.

Evaluation of shear bond strength and evaluation of dielectric breakdown voltage (withstand voltage) were performed on the obtained test piece by the following method.

Next, 3,000 thermal cycles of maintaining a temperature at −40° C. for 15 minutes and then maintaining a temperature at 150° C. for 15 minutes were performed using a thermal shock device TSE-12-A manufactured by ESPEC Corp. After this thermal cycling test, a dielectric breakdown voltage (withstand voltage) was evaluated again by the following method.

[Evaluation Items and Evaluation Methods for Composite Members]

(Shear Bond Strength)

A shear bond strength was measured according to JIS K 6850.

A shear force of the test piece of the composite member was measured using a Shimadzu/Autograph AGS-X manufactured by Shimadzu Corporation under conditions of 25° C. and a tensile speed of 1 mm/min. The measurement was performed twice, and an average value was defined as the shear bond strength.

(Dielectric Breakdown Voltage (Withstand Voltage) at Initial Stage and After Thermal Cycling Test)

Before the thermal cycling test (initial stage) and after the thermal cycling test, a dielectric breakdown voltage was measured by the following method.

The test piece of the composite member was left to stand overnight in an environment of 25° C. and 50% RH, and then a dielectric breakdown voltage was measured. Using a withstand voltage tester (TM650 manufactured by Tsuruga Electric Co., Ltd.), electrodes were attached to each of the heat dissipating base substrate and the member of the heat generating member in contact with the thermoconductive insulating adhesive film. A voltage was increased from 0 kV to 10 kV over 100 seconds under an environment of 25° C. and 50% RH, and a voltage at the point when a voltage exceeded the threshold value of 2 mA was read. The measurement was performed on four samples, and an average value was defined as a dielectric breakdown voltage. Evaluation was performed according to the following criteria.

A: A dielectric breakdown voltage was 6 kV or more.

B: A dielectric breakdown voltage was 3 kV or more and less than 6 kV.

C: A dielectric breakdown voltage was more than 0 kV and less than 3 kV.

D: Insulation breakdown occurred immediately after voltage application, and therefore measurement was not possible.

[Evaluation Results]

Table 2 shows values on the left side of Expressions (1-B) to (4-B) and evaluation results from each of Examples 1 to 11 and Comparative Examples 1 and 2.

In Examples 1 to 11, the values on the left side of Expressions (1-B) to (4-B) could all be made to 50 or more, preferably 100 or more, more preferably 150 or more, and particularly preferably 200 or more by adjusting the type of binder resin, a molecular weight of the binder resin, a ratio of the curing agent, a composition of the thermoconductive insulating sheet such as the type and amount of the thermoconductive insulating filler, and the heating and pressing conditions of the thermoconductive insulating sheet. In Examples 1 to 11, the test pieces of the composite members satisfying Expressions (1-0) to (4-0), preferably Expressions (1-1) to (4-1), more preferably Expressions (1-2) to (4-2), and particularly preferably Expressions (1-3) to (4-3) could be produced.

Based on the above results, it is considered that the test pieces of the composite members obtained in Examples 1 to 11 have favorable durability with respect to a temperature change ΔT of 50° C. or higher, preferably 100° C. or higher, more preferably 150° C. or higher, and particularly preferably 200° C. or higher. In the actual evaluation, in all of the test pieces of the composite members obtained in Examples 1 to 11, an initial dielectric breakdown voltage was favorable, and even after performing the thermal cycling test in which a temperature was changed between −40° C. and 150° C., a decrease in dielectric breakdown voltage was small, and durability was favorable.

In the test pieces of the composite members obtained in Comparative Examples 1 and 2, since the thermoconductive insulating sheet comprising a thermosetting epoxy resin as a binder resin was used, a flexibility of the thermoconductive insulating adhesive film was low, a modulus of elasticity of the thermoconductive insulating adhesive film was significantly higher than those of Examples 1 to 11, and a fracture elongation of the thermoconductive insulating adhesive film was significantly small. In the test pieces of the composite members obtained in Comparative Examples 1 and 2, values on the left side of Expressions (1-B) to (3-B) or Expressions (1-B) to (4-B) were less than 50. Based on these results, it is considered that the test pieces of the composite members obtained in Comparative Examples 1 and 2 cannot have favorable durability with respect to a temperature change ΔT of 100° C. or higher. In the actual evaluation, in all of the test pieces of the composite members obtained in Comparative Examples 1 and 2, an initial dielectric breakdown voltage was relatively favorable, but after performing the thermal cycling test in which a temperature was changed between −40° C. and 150° C., insulation breakdown occurred immediately after voltage application. It is considered that cracks and/or peeling occurred because the thermoconductive insulating adhesive film could not relieve thermal stress.

TABLE 1

| | Heat dissipating base substrate | | Member of heat generating member in contact with thermoconductive insulating adhesive film | | Thermoconductive insulating adhesive film | | | |
|---|---|---|---|---|---|---|---|---|
| | Material | CTE(A) $10^{-6}$/°C | Material | CTE(C) $10^{-6}$/°C | Thermoconductive insulating sheet | Number of layers | Heating and pressing conditions | E (MPa) −40°C |
| Example 1 | Al | 23 | Cu | 16 | S-1 | 3 | 60 min. at 150°C, 3 MPa | 2800 |
| Example 2 | Al | 23 | Cu | 16 | S-2 | 3 | 60 min. at 150°C, 3 MPa | 2800 |
| Example 3 | Al | 23 | Cu | 16 | S-3 | 3 | 60 min. at 150°C, 3 MPa | 2400 |
| Example 4 | Al | 23 | Epoxy resin | 62 | S-2 | 3 | 60 min. at 150°C, 3 MPa | 2800 |
| Example 5 | Al | 23 | Nichrome alloy | 107 | S-3 | 3 | 60 min. at 150°C, 3 MPa | 2400 |
| Example 6 | Al | 23 | Cu | 16 | S-4 | 3 | 60 min. at 150°C, 3 MPa | 6300 |
| Example 7 | Al | 23 | Cu | 16 | S-5 | 3 | 60 min. at 150°C, 3 MPa | 8400 |
| Example 8 | Al | 23 | Cu | 16 | S-6 | 1 | 60 min. at 150°C, 1 MPa | 1400 |
| Example 9 | Al | 23 | Cu | 16 | S-7 | 1 | 60 min. at 150°C, 1 MPa | 2400 |
| Example 10 | Al | 23 | Cu | 16 | S-8 | 1 | 60 min. at 150°C, 1 MPa | 3500 |
| Example 11 | Al | 23 | Cu | 16 | S-9 | 3 | 60 min. at 150°C, 3 MPa | 2800 |
| Comparative Example 1 | Al | 23 | Cu | 16 | S-11 | 1 | 60 min. at 150°C, 1 MPa | 280000 |
| Comparative Example 2 | Al | 23 | Cu | 16 | S-12 | 1 | 60 min. at 150°C, 1 MPa | 385000 |

| | Thermoconductive insulating adhesive film | | | | | | Shear bond strength X (MPa) |
|---|---|---|---|---|---|---|---|
| | E (MPa) 25°C | E (MPa) 175°C | CTE(B) $10^{-6}$/°C | Length L (BC) (m) | Length L (BA) (m) | Fracture elongation Y | |
| Example 1 | 400 | 160 | 50 | 0.04 | 0.04 | 0.200 | 4.0 |
| Example 2 | 400 | 160 | 55 | 0.04 | 0.04 | 0.200 | 4.0 |
| Example 3 | 60 | 36 | 75 | 0.04 | 0.04 | 0.350 | 3.0 |
| Example 4 | 400 | 160 | 55 | 0.04 | 0.04 | 0.200 | 3.0 |
| Example 5 | 60 | 36 | 75 | 0.04 | 0.04 | 0.300 | 3.0 |
| Example 6 | 900 | 360 | 30 | 0.04 | 0.04 | 0.100 | 3.0 |
| Example 7 | 1200 | 720 | 50 | 0.04 | 0.04 | 0.100 | 5.0 |
| Example 8 | 200 | 80 | 100 | 0.04 | 0.04 | 0.500 | 4.5 |
| Example 9 | 60 | 36 | 160 | 0.04 | 0.04 | 0.550 | 2.5 |

TABLE 1-continued

|  | | | | | | |  |
|---|---|---|---|---|---|---|---|
| Example 10 | 500 | 200 | 35 | 0.04 | 0.04 | 0.050 | 2.0 |
| Example 11 | 400 | 160 | 50 | 0.04 | 0.04 | 0.050 | 3.0 |
| Comparative Example 1 | 40000 | 16000 | 13 | 0.04 | 0.04 | 0.015 | 4.0 |
| Comparative Example 2 | 55000 | 22000 | 10 | 0.04 | 0.04 | 0.010 | 4.0 |

TABLE 2

|  | X/(E × \|CTE(B) − CTE(A)\|) | X/(E × \|CTE(B) − CTE(C)\|) | Y/\|CTE(B) − CTE(A)\| × L(BA) | Y/\|CTE(B) − CTE(C)\| × L(BC) | Dielectric breakdown voltage Initial | Dielectric breakdown voltage After thermal cycling test |
|---|---|---|---|---|---|---|
| Example 1 | 370 | 294 | 296 | 235 | A | A |
| Example 2 | 313 | 256 | 250 | 205 | A | A |
| Example 3 | 962 | 847 | 269 | 237 | A | A |
| Example 4 | 234 | 1071 | 250 | 1143 | A | A |
| Example 5 | 962 | 1563 | 231 | 375 | A | A |
| Example 6 | 476 | 238 | 571 | 286 | A | B |
| Example 7 | 154 | 123 | 148 | 118 | A | C |
| Example 8 | 292 | 268 | 260 | 238 | B | B |
| Example 9 | 304 | 289 | 161 | 153 | B | C |
| Example 10 | 333 | 211 | 167 | 105 | B | B |
| Example 11 | 278 | 221 | 74 | 59 | A | B |
| Comparative Example 1 | 10 | 33 | 60 | 200 | B | D (insulation breakdown) |
| Comparative Example 2 | 6 | 12 | 31 | 67 | B | D (insulation breakdown) |

The present invention is not limited to the above embodiments and examples, and designs thereof can be appropriately changed without departing from the spirit of the present invention.

This application claims priority based on Japanese Patent Application No. 2017-156413 filed on Aug. 14, 2017, the disclosure of which is incorporated herein by its entirety.

REFERENCE SIGNS LIST

1, 2, 3, 4, 5 Composite member
10 Heat generating member
20 Thermoconductive insulating adhesive film
30 Heat dissipating base substrate
50, 60 Power semiconductor module (heat generating member)
51, 61, 65 Base substrate
52, 62, 64 Solder layer
53, 63 Power semiconductor element (heat generating part)
54, 66 Sealing material

The invention claimed is:

1. A composite member,
wherein a heat dissipating base substrate is bonded to at least one surface of a heat generating member including a heat generating part capable of generating heat via a thermoconductive insulating adhesive film,
wherein a linear expansion coefficient of the thermoconductive insulating adhesive film is $15 \times 10^{-6}$ to $80 \times 10^{-6}$ (° C.$^{-1}$), and
wherein the composite member satisfies Expressions (1-0) to Expressions (4-0), where $|CTE(B)-CTE(A)|>0$, $|CTE(B)-CTE(C)|>0$, $$X/(E \times |CTE(B)-CTE(A)|) \geq 50 \quad (1\text{-}0)$$

$$X/(E \times |CTE(B)-CTE(C)|) \leq 50 \quad (2\text{-}0)$$

$$Y/|CTE(B)-CTE(A)| \times L(BA) \geq 50 \quad (3\text{-}0)$$

$$Y/|CTE(B)-CTE(C)| \times L(BC) \geq 50 \quad (4\text{-}0)$$

and
the symbols in the above expressions indicate the following parameters:
X: shear bond strength (MPa) at 25° C. between the heat dissipating base substrate and the heat generating member which are bonded to each other via the thermoconductive insulating adhesive film,
Y: fracture elongation at 25° C. of the thermoconductive insulating adhesive film,
E: modulus of elasticity (MPa) at 25° C. of the thermoconductive insulating adhesive film,
CTE(A): linear expansion coefficient (° C.$^{-1}$) of the heat dissipating base substrate,
CTE(B): linear expansion coefficient (° C.$^{-1}$) of the thermoconductive insulating adhesive film,
CTE(C): linear expansion coefficient (° C.$^{-1}$) of a material of a surface of the heat generating member in contact with the thermoconductive insulating adhesive film,
L(BA): initial maximum uniaxial length (m) of a region of the thermoconductive insulating adhesive film contact with the heat dissipating base substrate, and
L(BC): initial maximum uniaxial length (m) of a region of the thermoconductive insulating adhesive film in contact with the heat generating member.

2. The composite member according to claim 1, which satisfies Expressions (1-1) to Expressions (4-1):

$$X/(E \times |CTE(B)-CTE(A)|) \geq 100 \quad (1\text{-}1)$$

$$X/(E \times |CTE(B)-CTE(C)|) \geq 100 \quad (2\text{-}1)$$

$$Y/|CTE(B)-CTE(A)| \times L(BA) \geq 100 \quad (3\text{-}1)$$

$$Y/|CTE(B)-CTE(C)| \times L(BC) \geq 100 \quad (4\text{-}1).$$

3. The composite member according to claim 1, which satisfies Expressions (1-2) to Expressions (4-2):

$$X/(E \times |CTE(B)-CTE(A)|) \geq 150 \quad (1\text{-}2)$$

$$X/(E \times |CTE(B)-CTE(C)|) \geq 150 \quad (2\text{-}2)$$

$$Y/|CTE(B)-CTE(A)| \times L(BA) \geq 150 \quad (3\text{-}2)$$

$$Y/|CTE(B)-CTE(C)| \times L(BC) \geq 150 \quad (4\text{-}2).$$

4. The composite member according to claim 1, which satisfies Expressions (1-3) to Expressions (4-3):

$$X/(E \times |CTE(B)-CTE(A)|) \geq 200 \quad (1\text{-}3)$$

$$X/(E \times |CTE(B)-CTE(C)|) \geq 200 \quad (2\text{-}3)$$

$$Y/|CTE(B)-CTE(A)| \times L(BA) \geq 200 \quad (3\text{-}3)$$

$$Y/|CTE(B)-CTE(C)| \times L(BC) \geq 200 \quad (4\text{-}3).$$

5. The composite member according to claim 1, wherein the thermoconductive insulating adhesive film includes a thermoconductive insulating tiller and a binder resin.

6. The composite member according to claim 1, wherein a material of the heat dissipating base substrate is a metal, and a material of a surface of the heat generating member in contact with the thermoconductive insulating adhesive film is a metal and/or a resin.

7. The composite member according to claim 1, wherein a modulus of elasticity of the thermoconductive insulating adhesive film in a range of greater than or equal to −40° C. and less than 25° C. is 10 GPa or less, and a modulus of elasticity of the thermoconductive insulating adhesive film in a range of greater than or equal to 25° C. and less than or equal to 200° C. is 1 GPa or less.

8. The composite member according to claim 1, wherein a fracture elongation of the thermoconductive insulating adhesive film is 0.02 or more at 25° C.

9. The composite member according to claim 1, wherein the heat generating member includes a power semiconductor element.

10. The composite member according to claim 2, wherein a modulus of elasticity of the thermoconductive insulating adhesive film in a range of greater than or equal to −40° C. and less than 25° C. is 10 GPa or less, and a modulus of elasticity of the thermoconductive insulating adhesive film in a range of greater than or equal to 25° C. and less than or equal to 200° C. is 1 GPa or less.

11. The composite member according to claim 3, wherein a modulus of elasticity of the thermoconductive insulating adhesive film in a range of greater than or equal to −40° C. and less than 25° C. is 10 GPa or less, and a modulus of elasticity of the thermoconductive insulating adhesive film in a range of greater than or equal to 25° C. and less than or equal to 200° C. is 1 GPa or less.

12. The composite member according to claim 4, wherein a modulus of elasticity of the thermoconductive insulating adhesive film in a range of greater than or equal to −40° C. and less than 25° C. is 10 GPa or less, and a modulus of elasticity of the thermoconductive insulating adhesive film in a range of greater than or equal to 25° C. and less than or equal to 200° C. is 1 GPa or less.

13. The composite member according to claim 2, wherein a fracture elongation of the thermoconductive insulating adhesive film is 0.02 or more at 25° C.

14. The composite member according to claim 3, wherein a fracture elongation of the thermoconductive insulating adhesive film is 0.02 or more at 25° C.

15. The composite member according to claim 4, wherein a fracture elongation of the thermoconductive insulating adhesive film is 0.02 or more at 25° C.

* * * * *